(12) United States Patent
Yamaguchi et al.

(10) Patent No.: US 10,453,965 B2
(45) Date of Patent: Oct. 22, 2019

(54) DISPLAY DEVICE

(71) Applicant: Japan Display Inc., Minato-ku (JP)

(72) Inventors: Yohei Yamaguchi, Minato-ku (JP); Isao Suzumura, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/892,513

(22) Filed: Feb. 9, 2018

(65) Prior Publication Data
US 2018/0286888 A1 Oct. 4, 2018

(30) Foreign Application Priority Data

Mar. 29, 2017 (JP) ................. 2017-064916

(51) Int. Cl.
*H01L 29/786* (2006.01)
*H01L 27/12* (2006.01)
(Continued)

(52) U.S. Cl.
CPC ........ *H01L 29/7869* (2013.01); *H01L 27/124* (2013.01); *H01L 27/1218* (2013.01); *H01L 27/1222* (2013.01); *H01L 27/1225* (2013.01); *H01L 27/1248* (2013.01); *H01L 27/1251* (2013.01); *H01L 27/14692* (2013.01); *H01L 29/42384* (2013.01); *H01L 29/4908* (2013.01); *H01L 29/4966* (2013.01); *H01L 29/513* (2013.01); *H01L 29/517* (2013.01);
(Continued)

(58) Field of Classification Search
CPC ............... H01L 21/702; H01L 21/707; H01L 27/14692; H01L 29/42384; H01L 29/42388; H01L 29/4908; H01L 29/4916; H01L 29/495; H01L 29/4966; H01L 29/51; H01L 29/511; H01L 29/512; H01L 29/513; H01L 29/517; H01L 29/518; H01L 29/66742; H01L 29/66757; H01L 29/66765; H01L 29/66818; H01L 29/786; H01L 29/78618; H01L 29/7869; H01L 29/78693
See application file for complete search history.

(56) References Cited

U.S. PATENT DOCUMENTS 8,791,463 B2 * 7/2014 Misaki ................ H01L 29/7869
257/59
10,038,100 B2 * 7/2018 Yamazaki ........... H01L 27/1225
(Continued)

FOREIGN PATENT DOCUMENTS

JP 2012-015436 1/2012
JP 2015-092638 5/2015
WO WO 2010/041686 A1 4/2010

*Primary Examiner* — Eduardo A Rodela
(74) *Attorney, Agent, or Firm* — Oblon, McClelland, Maier & Neustadt, L.L.P.

(57) ABSTRACT

The purpose of the present invention is to realize the TFT of the oxide semiconductor having a superior characteristics and high reliability during the product's life. The structure of the present invention is as follows. A display device comprising: a substrate including a display area where plural pixels are formed, the pixel includes a first TFT of a first oxide semiconductor, a first gate insulating film is formed on the first oxide semiconductor, the first gate insulating film is a laminated film of a first silicon oxide film and a first aluminum oxide film, a gate electrode is formed on the first aluminum film.

18 Claims, 10 Drawing Sheets

(51) Int. Cl.
*H01L 29/49* (2006.01)
*H01L 29/51* (2006.01)
*H01L 27/146* (2006.01)
*H01L 29/423* (2006.01)
*H01L 27/32* (2006.01)
*G02F 1/1362* (2006.01)
*G02F 1/1368* (2006.01)

(52) U.S. Cl.
CPC .......... *H01L 29/518* (2013.01); *H01L 29/786* (2013.01); *H01L 29/78648* (2013.01); *H01L 29/78675* (2013.01); *G02F 1/1368* (2013.01); *G02F 1/136286* (2013.01); *G02F 2001/13685* (2013.01); *G02F 2202/10* (2013.01); *G02F 2202/104* (2013.01); *H01L 27/3262* (2013.01); *H01L 27/3276* (2013.01)

(56) References Cited

U.S. PATENT DOCUMENTS

| | | | |
|---|---|---|---|
| 2002/0192885 A1* | 12/2002 | Miyasaka | H01L 29/66757 438/164 |
| 2011/0156022 A1 | 6/2011 | Yamazaki et al. | |
| 2012/0001167 A1 | 1/2012 | Morosawa | |
| 2013/0240878 A1 | 9/2013 | Morosawa et al. | |
| 2015/0115258 A1* | 4/2015 | Beak | H01L 27/1225 257/43 |
| 2015/0372021 A1* | 12/2015 | Yuan | H01L 29/78678 257/72 |

* cited by examiner

DISPLAY DEVICE

CLAIM OF PRIORITY

The present application claims priority from Japanese Patent Application JP 2017-064916 filed on Mar. 29, 2017, the content of which is hereby incorporated by reference into this application.

BACKGROUND OF THE INVENTION (1) Field of the Invention

The present invention relates to a display device comprising TFTs (Thin Film Transistor) that use oxide semiconductors.

(2) Description of the Related Art

A liquid crystal display device or an organic EL display device uses TFTs for switching elements in the pixels or for the built in driving circuits. The TFT uses one of a-Si (amorphous Silicon), poly-Si (poly Silicon) or oxide semiconductor as an active layer.

The a-Si has low mobility; consequently, there are some problems to use the a-Si in the TFTs for the peripheral driving circuits. The poly-Si has high mobility, which is suitable for the TFTs for the peripheral driving circuits; however, the poly-Si has some problems for the switching TFTs in the pixels since it has bigger leak current. The oxide semiconductor has low leak current and the mobility is higher than the mobility of the a-Si; however, it has some problems of reliability in controlling defects in the semiconductor layer.

The patent document 1 (Japanese patent laid open 2012-15436) discloses the structure that the entire of the TFT, which comprises the oxide semiconductor and gate electrode, is covered by the inorganic insulating film of e.g. aluminum oxide, titanium oxide or indium oxide.

The patent document 2 (Japanese patent laid open 2015-92638) discloses the structure to suppress the gate leak caused by the tunnel effect when the gate insulating film becomes thin. The patent document 2 discloses to use the material of high dielectric constant as e.g. hafnium oxide, tantalum oxide laminated with silicon oxide, silicon nitride or aluminum oxide, etc. for the gate insulating film.

The patent document 3 (WO 2010/041686) discloses to sandwich the channel of the oxide semiconductor by the inorganic insulating film to stabilize the characteristics of the TFT. The patent document 3 discloses to use e.g. aluminum oxide, titanium oxide or indium oxide for the inorganic insulating film.

SUMMARY OF THE INVENTION

Examples of the oxide semiconductors are: IGZO (Indium Gallium Zinc Oxide), ITZO (Indium Tin Zinc Oxide), ZnON (Zinc Oxide Nitride), IGO (Indium Gallium Oxide), and so on. Since those semiconductors are transparent, they are sometimes called TAOS (Transparent Amorphous Oxide Semiconductor). By the way, for example, The ratio of the components of IGZO is generally In:Ga:Zn=1:1:1, however, in this specification, IGZO includes that deviated from the above ratio.

The initial characteristics of the TFT using the oxide semiconductor can be controlled by the amount of oxide in the oxide semiconductor or in the insulating film that contacts with the oxide semiconductor; however, controlling the reliability is difficult. Specific problem is that defects in the insulating layer increase when the amount of oxygen increases. Therefore, conventionally, the initial characteristics and the reliability have been in a relation of trade off.

Further, there has been a problem as that: even the amount of oxygen is controlled initially, the oxygen gradually moves out from the oxide semiconductor during the product's life, consequently, the characteristics of the TFT change.

The purpose of the present invention is to realize the TFT formed by the oxide semiconductor that satisfies both of the initial characteristics and the high reliability during the product's life.

The present invention solves the above problem; the concrete measures of the present inventions are as follows:

(1) A display device comprising: a substrate including a display area where plural pixels are formed, the pixel includes a first TFT of a first oxide semiconductor, a first gate insulating film is formed on the first oxide semiconductor, the first gate insulating film is a laminated film of a first silicon oxide film and a first aluminum oxide film, a gate electrode is formed on the first aluminum film.

(2) The display device according to (1), wherein the first gate electrode is formed by a laminated film that a second oxide semiconductor is laminated by a metal.

(3) The display device according to (1), wherein an interlayer insulating film is formed covering the first gate insulating film and the first gate electrode, defect density of the first silicon oxide film is less than defect density of the interlayer insulating film, the defect density of the first silicon oxide film is $1 \times 10^{18}$ (spins/cm$^3$) or less by ESR (Electrode Spin resonance) analysis.

(4) The display device according to (3), wherein a desorption of oxygen from the first silicon oxide film in TDS (Thermal Desorption Spectrometry) analysis, provided M/z=32, the desorption of oxygen ($O_2$) is $1 \times 10^{15}$ (molecules/cm$^2$) or more at the temperature of 100 to 250 centigrade.

DETAILED DESCRIPTION OF THE PREFERRED EMBODIMENTS

The present invention will be described in detail referring to the following embodiments.

First Embodiment

Figure 1:
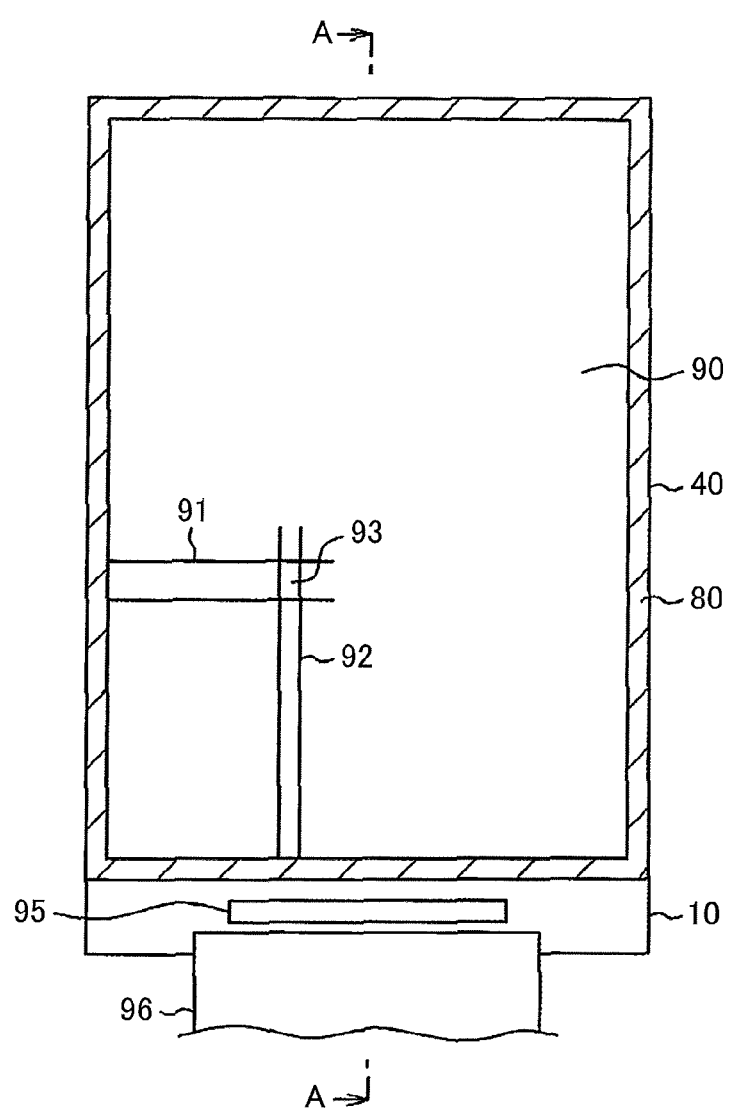
FIG. 1 is a plan view of a liquid crystal display device.

FIG. 1 is a plan view of a liquid crystal display device, which is used in e.g. the cellar phone, where the present invention is applied. In FIG. 1, the TFT substrate 10, in which plural pixels 93 are formed, and the counter substrate 40 are adhered by the seal material 80. The liquid crystal is sandwiched between the TFT substrate 10 and the counter substrate 40. The display area 90 is formed inside of the seal material 80. In the display area 90, the scan lines 91 extend in lateral direction and arranged in longitudinal direction; the video signal lines 92 extend in longitudinal direction and arranged in lateral direction The pixel 93 is formed in the area surrounded by the scan lines 91 and the video signal lines 92. In each of the pixels 93, the pixel electrode and the TFT, which controls the signals that are supplied to the pixel electrode, are formed. The TFT substrate 10 is made bigger than the counter substrate 40; the portion of the TFT substrate 10 that doesn't overlap with the counter substrate 40 is the terminal area. The driver IC 95 is installed in the terminal area; the flexible wiring substrate 96 is connected to the terminal area to supply signals and powers to the liquid crystal display device.

Figure 2:
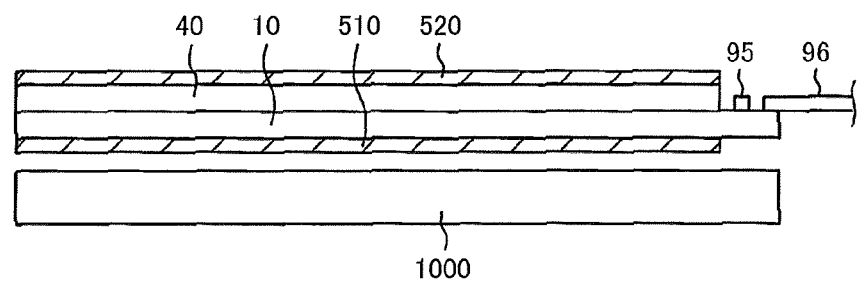
FIG. 2 is a cross sectional view, along the line A-A of FIG. 1.

FIG. 2 is cross sectional view along the line A-A of FIG. 1. In FIG. 2, the TFT substrate 10 and the counter substrate 40 are overlapped to each other. The liquid crystal layer is omitted in FIG. 2 since the thickness of the liquid crystal layer is much thinner than the thicknesses of the TFT substrate 10 and the counter substrate 40. The portion where the TFT substrate 10 and the counter substrate 40 don't overlap is the terminal area where the driver IC 95 is installed and the flexible wiring substrate 96 is connected.

Since the liquid crystal is not self-illuminant, the back light 1000 is set at the rear side of the TFT substrate 10. Images are formed by controlling the light from the back light 1000 in each of the pixels. Since the liquid crystal controls only the polarized light, the lower polarizing plate 510 is adhered to underneath the TFT substrate 10, and the upper polarizing plate 520 is adhered to on the counter substrate 40.

Figure 3:
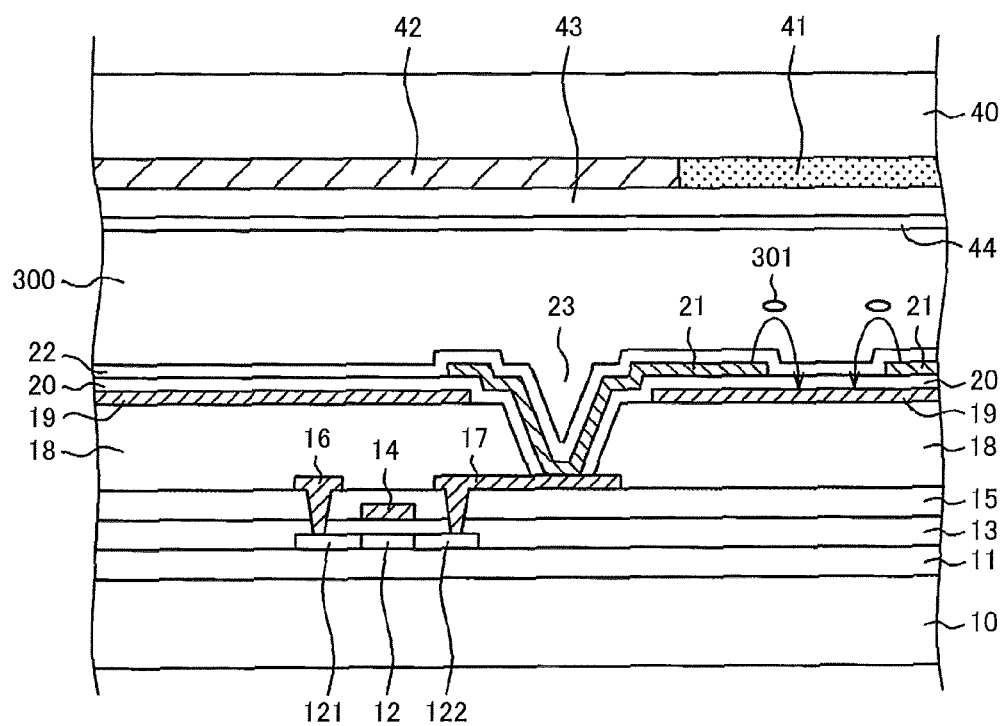
FIG. 3 is a cross sectional view of the display area of the liquid crystal display device.

FIG. 3 is a cross sectional view of the display area 90 of the liquid crystal display device. In FIG. 3, the TFT substrate 10 is formed by glass or resin. The undercoat 11 is formed on the TFT substrate 10 to prevent the semiconductor layer from being contaminated by impurities from the glass or resin. The undercoat 11 is a laminated film of the silicon oxide film (it may be called SiO layer herein after) and the silicon nitride film (it may be called SiN layer herein after); sometimes the aluminum oxide (it may be called AlO herein after) film is laminated, too.

The oxide semiconductor 12 of e.g. IGZO is formed on the undercoat 11. The gate insulating film 13 is formed covering the oxide semiconductor 12. In the present invention, as will be explained later, the gate insulating film 13 has a structure that aluminum oxide film is laminated on the silicon oxide film. The gate electrode 14 is formed on the gate insulating film 13. In the present embodiment, as will be explained later, the gate electrode 14 is a laminated film of the second oxide semiconductor and the metal film. The metal film is preferably formed by Mo, W or alloys of those metals.

In FIG. 3, after the gate electrode 14 is formed, the ion implantation is applied to the oxide semiconductor 12 using the gate electrode 14 as a mask to form defects in the oxide semiconductor 12 to give conductivity; thus, the drain area 121 and the source area 122 are formed in the oxide semiconductor 12. The interlayer insulating film 15 is formed covering the gate electrode 14 and the gate insulating film 13. The interlayer insulating film 15 is formed by the silicon oxide film; however, it can be formed by the silicon nitride film or a laminated film of the silicon oxide film and the silicon nitride film. The through holes are made through the interlayer insulating film 15 and the gate insulating film 13 to connect the drain electrode 16 with the drain area 121, and the source electrode 17 with the source area 122. The drain electrode 16 connects with the video signal line 92 and the source electrode 17 connects with the pixel electrode 21 through the through hole 23.

The organic passivation film 18 is formed covering the interlayer insulating film 15, drain electrode 16 and the source electrode 17. The organic passivation film 18 is made as thick as 2 µm to 4 µm since it has also a role as a flattening film. The through hole 23 is formed in the organic passivation film 18 to connect the pixel electrode 21 and the source electrode 17 of the TFT.

The common electrode 19 is formed in a solid plane shape on the organic passivation film 18. The capacitive insulating film 20 of SiN is formed covering the common electrode 19; the pixel electrode 21 is formed on the capacitive insulating film 20. The capacitive insulating film 20 is so called because a holding capacitance is formed between the common electrode 19 and the pixel electrode 21 via the capacitive insulating film 20. The alignment film 22 is formed covering the pixel electrode 21 for an initial alignment of the liquid crystal molecules. The pixel electrode is stripe shaped or comb shaped in a plan view. When the voltage is applied to the pixel electrode 21, the line of force as depicted by arrows in FIG. 3 is generated, whereby the liquid crystal molecules 301 are rotated, thus the transmittance of the light from the back light is controlled in a pixel.

In FIG. 3, the counter substrate 40 is set to sandwich the liquid crystal layer 300 with the TFT substrate 10. On the inner side of the counter substrate 40, the color filter 41 is formed corresponding to the pixel electrode 21 to form the color images. The black matrix 42 is formed between the color filters 41 to improve the contrast of the images. The overcoat film 43 is formed covering the color filter 41 and the black matrix 42. The overcoat film 43 prevents that the pigments in the color filter 41 goes out and contaminates the liquid crystal layer 300. The alignment film 44 is formed covering the overcoat film 43.

Figure 4:
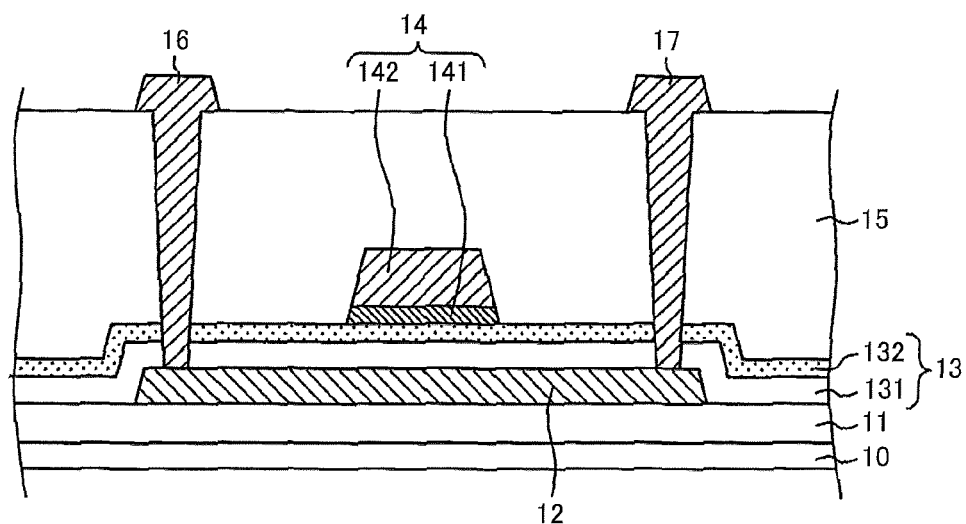
FIG. 4 is a cross sectional view of the first embodiment.

FIG. 4 is a cross sectional view of the first embodiment of the present invention. In FIG. 4, the first oxide semiconductor 12 formed by e.g. IGZO is fabricated on the undercoat 11, which is formed by a laminated film of the SiO layer and the SiN layer. The thickness of the first oxide semiconductor 12 is 10 nm to 70 nm. The gate insulating film 13 is formed covering the first oxide semiconductor 12. The gate insulating film 13 is a laminated film of the silicon oxide film 131 and the first aluminum oxide film 132. The thickness of the silicon oxide film 131 that constitutes the gate insulating film 13 is 50 nm to 200 nm; the thickness of the first aluminum oxide film 132, which covers the silicon oxide film 131, is 1 nm to 20 nm.

In FIG. 4, the gate electrode 14 is formed on the first aluminum oxide film 132; the gate electrode 14 is a laminated film of the second oxide semiconductor 141 and the metal layer 142. The metal layer 142 is formed by e.g. Mo or W or alloys of those metals. The second oxide semiconductor 141 is formed by e.g. IGZO. The materials for the first oxide semiconductor 12 and the second oxide semiconductor 141 are not necessarily the same; however, the process becomes simpler if the same material is used. The thickness of the second oxide semiconductor 141 is 1 nm to 30 nm.

The characteristics of the TFT using the oxide semiconductor 12 is maintained by oxygen supplied from the gate insulating film 13. The gate insulating film 13 needs to have many defects to supply oxygen to the oxide semiconductor 12. The gate insulating film 13 having many defects, however, tends to absorb the gasses used in the process, which deteriorate the characteristics of the oxide semiconductor 12.

The feature of the present invention is to use the gate insulating film 13 comprises the silicon oxide 131 having less defects, and the aluminum oxide film 132 which is laminated on the silicon oxide 131. According to this structure, the oxygen is supplied to the first oxide semiconductor 12 from the aluminum oxide film 132 through the silicon oxide film 131; thus, the characteristics of the first oxide semiconductor 12 can be maintained stable.

Further, the present invention uses the second oxide semiconductor 141 as the lower layer of the gate electrode 14; thus, the oxygen is supplied to the first oxide semiconductor 12 of the TFT from the second oxide semiconductor 141. In addition, the substrate is annealed when the second semiconductor 141 is made; during the annealing, the oxygen, which is emitted from the aluminum oxide film 132, is supplied to the first oxide semiconductor 12, which constitutes the TFT. Therefore, according to the present invention, even the silicon oxide film 131 of less defects is used as the gate insulating film 13, the characteristics of the first oxide semiconductor 12 can be maintained; thus, reliability of the TFT using the oxide semiconductor 12 can be improved.

The required characteristics of the silicon oxide film 131 constituting the gate insulating film 13 is as follows. Firstly, the defect density is low; concretely, $1 \times 10^{18}$ (spins/cm$^3$) or less by ESR (Electron Spin resonance) analysis. The measurement condition of the ESR is: the temperature 85K; the power of the microwave is 10 mw; the direction the magnetic field is parallel to the surface of the film; the range of the magnetic field is 317±25 mT; the modulation bandwidth is 0.5 mT; the modulation frequency is 100 kHz; the time constant is 0.03 sec.

Secondly, enough oxygen must be supplied to maintain the characteristics of the first oxide semiconductor 12; concretely, in TDS (Thermal Desorption Spectrometry) analysis, provided M/z=32, the desorption of oxygen ($O_2$) is $1 \times 10^{15}$ (molecules/cm$^2$) or more at the temperature of 100 to 250 centigrade. The conventional gate insulating layer 103 could not satisfy the requirements 1 and 2.

Thirdly, desorption of gasses other than oxygen is low. The TFT substrate goes through in various processes; thus, if the defects in the film are many, the gasses used in the process are absorbed in the defects; the absorbed gasses deteriorate the characteristics of the oxide semiconductor 12. Thus, the silicon oxide film 131 of low defects can improve the reliability of the TFT that uses the oxide semiconductor 12.

Among the gasses used in the processes, $N_2O$ is evaluated as a concrete example as follows: in TDS analysis, provided M/z=44, the desorption of $N_2O$ is $8 \times 10^{13}$ (molecules/cm$^2$) or less at the temperature of 100 to 400 centigrade.

The above characteristics are the silicon oxide film 131 in a completed display device. As to the measurement of the silicon oxide film 131 in a completed display device, the upper layers formed over the gate insulating film 13 constituted by the silicon oxide film 131 are taken away; then, the ESR or the TDS are applied.

In FIG. 4, the undercoat 11 is formed by two layers of the SiN layer and the SiO layer. The lower layer is the SiN layer and the upper layer is the SiO layer. The SiN layer is indispensable since it is superior in blocking the moisture; however it can be a source of hydrogen that deoxidizes the oxide semiconductor 12. Therefore, the SiO layer is laminated on the SiN layer. The SiN layer and the SiO layer are formed continuously by CVD.

Since the upper layer of the silicon oxide (SiO) directly contacts the oxide semiconductor 12, the characteristics of the SiO layer must be controlled; the concrete characteristics are the same as the SiO layer of the gate insulating film 13. Firstly, the defect density is low; concretely, $1 \times 10^{18}$ (spins/cm$^3$) or less by ESR (Electrode Spin resonance) analysis. By the way, the defect density of the interlayer insulating film 15 is $1 \times 10^{18}$ (spins/cm$^3$) or more by the ESR analysis. Secondly, enough oxygen must be supplied to maintain the characteristics of the first oxide semiconductor; concretely, in TDS (Thermal Desorption Spectrometry) analysis, when M/z=32, the desorption of oxygen ($O_2$) is $1 \times 10^{15}$ (molecules/cm2) or more at the temperature of 100 to 250 centigrade. Thirdly, desorption of gasses other than oxygen is low; if $N_2O$ is evaluated as a concrete example: in TDS analysis, provided M/z=44, the desorption of $N_2O$ is $8 \times 10^{13}$ (molecules/cm2) or less at the temperature of 100 to 400 centigrade.

The measurement of the silicon oxide (SiO) layer in the undercoat 11 is the same as the measurement of the silicon oxide film 131 in the gate insulating film 13; namely, the upper layers formed over the undercoat 11 are taken away, then, the ESR or the TDS are applied to the silicon oxide (SiO) layer in the undercoat 11.

Figure 5:
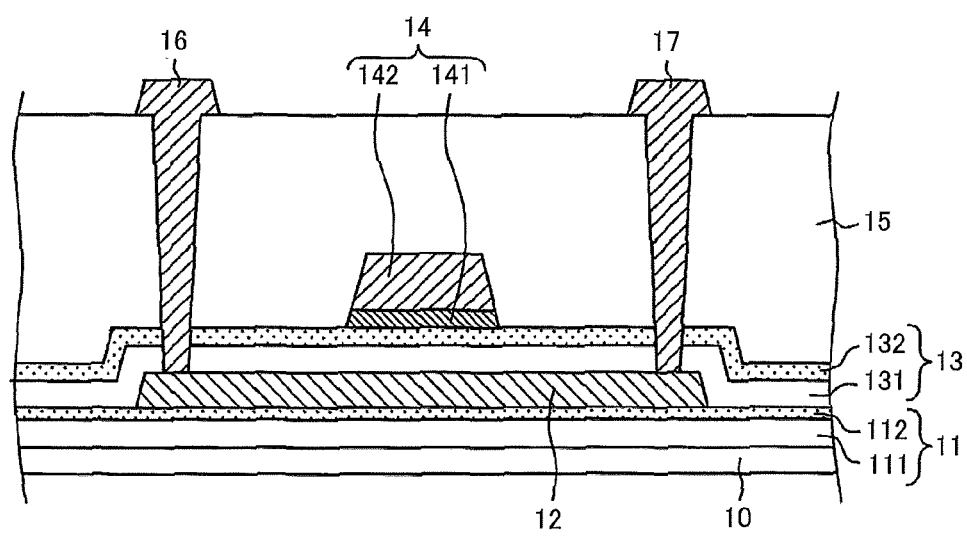
FIG. 5 is a cross sectional view of the second example of the first embodiment.

FIG. 5 is a cross sectional view of the second example of the present embodiment. FIG. 5 differs from FIG. 4 in that the second aluminum oxide film 112 is added in the undercoat 11. The thickness of the second aluminum oxide film 112, too, is 1 nm to 20 nm. In FIG. 5, the second aluminum oxide film 112 is formed on the laminated layer 111 of the SiO layer and the SiN layer. When the undercoat is a laminated layer of three layers of SiO/SiN/SiO, the aluminum oxide layer 112 can be laminated on the upper most SiO layer, or the upper most SiO layer can be substituted by the aluminum oxide layer 112.

The second aluminum oxide film 112 not only has superior characteristics in blocking moisture and other gasses but also can be a source of the oxygen to the oxide semiconductor 12; therefore, it is suitable for the undercoat for the oxide semiconductor 12. On the other hand, the second aluminum oxide film 112 has more defects in the film compared with the silicon oxide film; therefore, there is a possibility that gasses absorbed in the defects in the second aluminum oxide film 112 deteriorate the oxide semiconductor 12. However, the characteristics of the TFT is mainly governed by the characteristics of the oxide semiconductor 12 on the side facing the first gate insulating film 13, thus, the defects in the second aluminum oxide film 112 do not raise a big problem.

Figure 6:
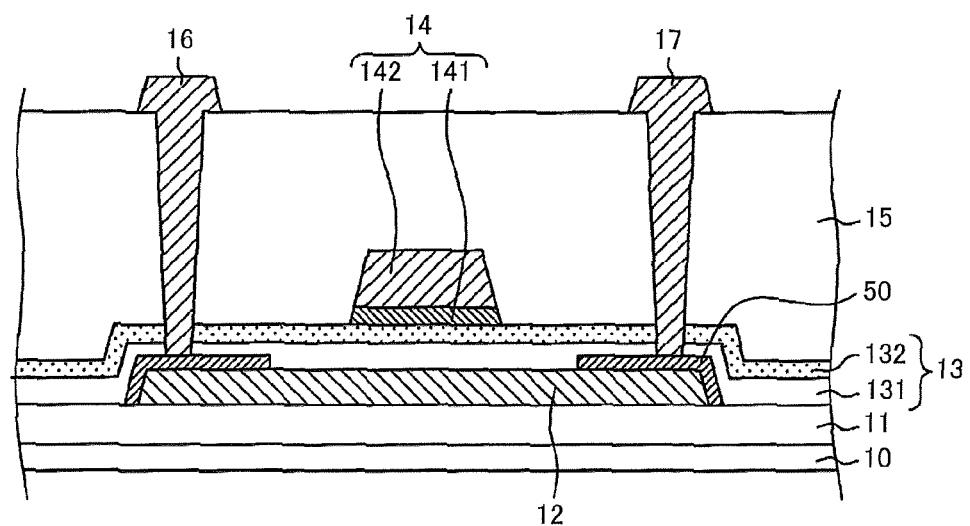
FIG. 6 is a cross sectional view of the third example of the first embodiment.

FIG. 6 is a cross sectional view of the third example of the present embodiment. FIG. 6 differs from FIG. 4 in that the metal protective layer 50 is formed between the drain electrode 16 and the oxide semiconductor 12, and between the source electrode 17 and the oxide semiconductor 12. The drain electrode 16 and the source electrode 17 are formed in the through holes formed in the interlayer insulating film 15 and the gate insulating film 13. The through holes are made by e.g. dry etching. Since the thickness of the first oxide semiconductor 12 is very thin as 10 nm to 70 nm, there is a danger that the oxide semiconductor 12 disappears at the through holes when the thorough holes are made in the interlayer insulating film 15 and the gate insulating film 13.

In FIG. 6, the metal protective layer 50 is formed between the drain electrode 16 and the oxide semiconductor 12, and between the source electrode 17 and the oxide semiconductor 12; thus, the oxide semiconductor 12 is protected from being eliminated by the etching. The metals for the protective metal 50 can be the same as the metals for the video signal lines 92; they can be e.g. the laminated film that Al alloy is sandwiched by Titanium. The structure of FIG. 6 realizes the TFT of the oxide semiconductor having high reliability.

The Second Embodiment

Figure 7:
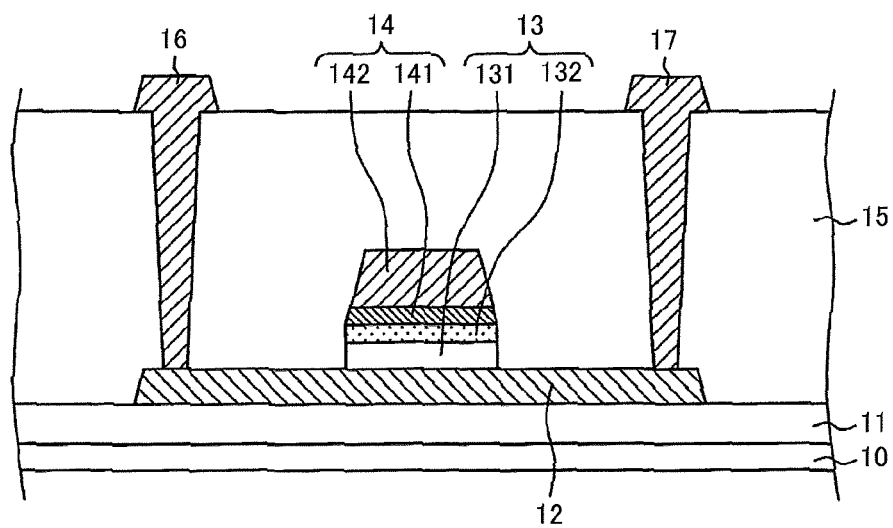
FIG. 7 is a cross sectional view of the second embodiment.

FIG. 7 is a cross sectional view of the second embodiment. FIG. 7 differs from FIG. 4 in that the gate insulating film 13 is formed only under the gate electrode 14. In FIG. 7, the silicon oxide film 131, which constitutes the gate insulating film 13, is formed on the first oxide semiconductor 12; the aluminum oxide film 132 is formed on the silicon oxide film 131. The thickness of the silicon oxide film 131 and the aluminum oxide film 132 are the same as the ones in the first embodiment.

In FIG. 7, the silicon oxide film 131 and the aluminum oxide film 132 are eliminated except underneath the gate electrode 13. The merit of FIG. 7 is as follows. The first oxide semiconductor 12 needs to be conductive except at the channel. For that purpose, in the structure of FIG. 4, the ion implantation is applied to the oxide semiconductor 12 using the gate electrode 14 as a mask to form the defects in the semiconductor for conductivity.

In the structure of FIG. 7, the oxide semiconductor 12 is exposed after the gate insulating film 13 is eliminated except under the gate electrode 14. In this state, if the oxide semiconductor is exposed to e.g. silane ($SiH_4$), the exposed portion of the oxide semiconductor is reduced and gets conductivity. Alternatively, if the exposed portion of the oxide semiconductor 12 is applied with the Ar plasma or $N_2$ plasma, the oxide semiconductor 12 gets defects, thus, the oxide semiconductor 12 becomes conductive at the exposed portion. Therefore, in the present embodiment, the oxide semiconductor 12 can get necessary characteristics without applying the ion implantation.

In FIG. 7, after the necessary conductivity is given to the oxide semiconductor 12, the interlayer insulating film 15 is formed on the gate electrode 14 and the first oxide semiconductor 12 by the SiO layer or the SiN layer, or the lamination film of the SiO layer and the SiN layer. As explained in the first embodiment, the second aluminum oxide film 112 can be added in the undercoat 11; the metal protective layer 50 can be applied on the drain area and the source area of the oxide semiconductor 12. The performance of the TFT of the present embodiment is the same as the TFT of the first embodiment.

Third Embodiment

Figure 8:
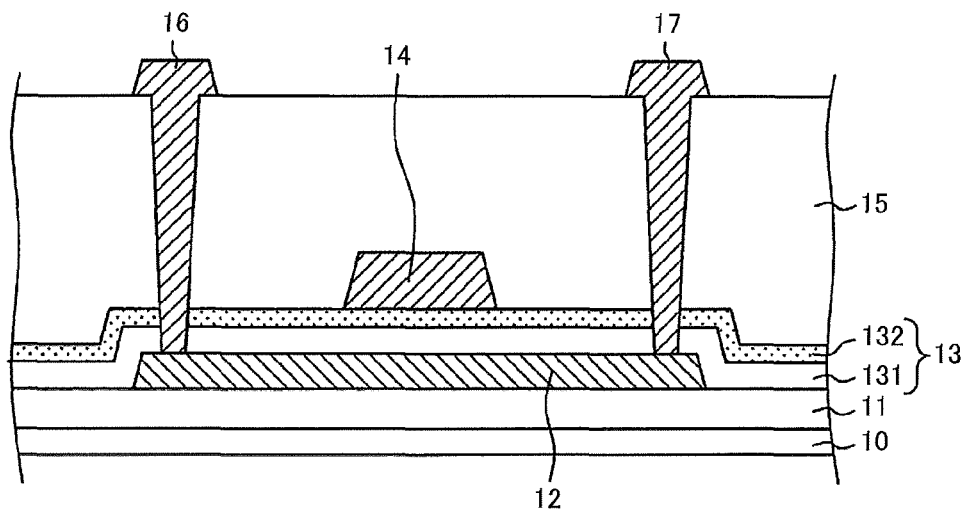
FIG. 8 is a cross sectional view of the third embodiment.

FIG. 8 is a cross sectional view of the third embodiment of the present invention. FIG. 8 differs from FIG. 4 of the first embodiment in that the gate electrode 14 is formed only by the metal; the second oxide semiconductor does not exist. In this case, the second aluminum oxide film 132 becomes a source of the oxygen for the first oxide semiconductor 12. Therefore, the silicon oxide layer 131 constituting the gate insulating film 13 can be made to have low defects.

The aluminum oxide film 132 is a source of the oxygen for the oxide semiconductor 12; at the same time, it can have a role to confine the oxygen in the oxide semiconductor side, therefore, in many cases, the first oxide semiconductor 12 can maintain excellent performance and high reliability.

In the third embodiment, too, as explained in the first embodiment, the second aluminum oxide film 112 can be added in the undercoat 11; the metal protective layer 50 can be applied on the drain area and the source area of the oxide semiconductor 12. The structure of the second embodiment is also applicable to the third embodiment.

Fourth Embodiment

Figure 9:
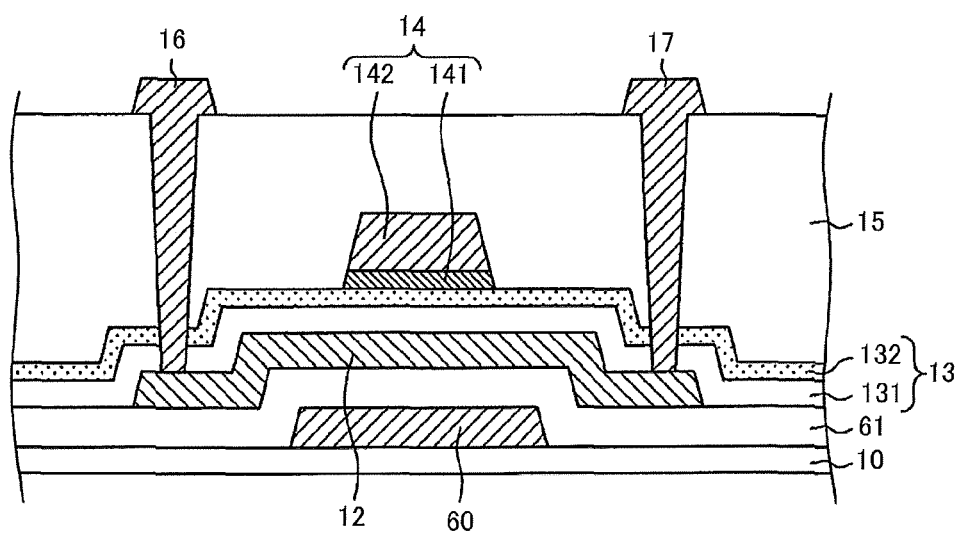
FIG. 9 is a cross sectional view of the fourth embodiment.

FIG. 9 is a cross sectional view of the fourth embodiment of the present invention. The ON current in the TFT of the oxide semiconductor 12 can be 10 times bigger than the ON current in the TFT of the a-Si; however, the ON current is not so big as the TFT of the poly-Si. The dual gate structure can be adopted in the TFT of the oxide semiconductor 12 to increase the ON current.

FIG. 9 is a cross sectional view that shows this feature. In FIG. 9, the second gate electrode 60 is formed on the TFT substrate 10; the second gate insulating film 61 is formed on the second gate electrode 60; the first oxide semiconductor 12 is formed on the second gate insulating film 61. The upper layers over the first oxide semiconductor 12 are the same as in FIG. 4 of the first embodiment.

According to the structure of FIG. 9, the current can flow at the upper side and at the lower side of the first oxide semiconductor 12; thus, the ON current can be increased. In FIG. 9, the second gate insulating film 61 is a silicon oxide film; the second gate electrode 60 is metal of e.g. Mo or W, or alloys of those metals. The second gate insulating film 61 can be a laminated film of the silicon nitride film and the silicon oxide film; in this case, the silicon nitride film is the lower layer and the silicon oxide film is the upper layer.

Figure 10:
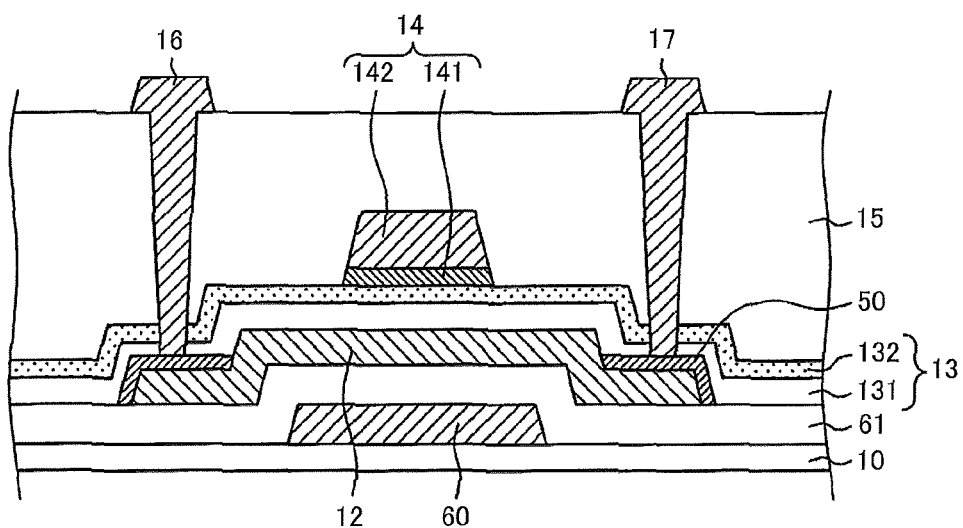
FIG. 10 is a cross sectional view of the second example of the fourth embodiment.

FIG. 10 is the structure that the protective layer 50 is added on the drain area and the source area of the oxide semiconductor 12 in FIG. 9. The purpose of the structure is the same as explained in FIG. 6 of the first embodiment; namely, to avoid the oxide semiconductor 12 from disappearing when the through holes are made in the interlayer insulating film 15 and in the gate insulating film 13.

Figure 11:
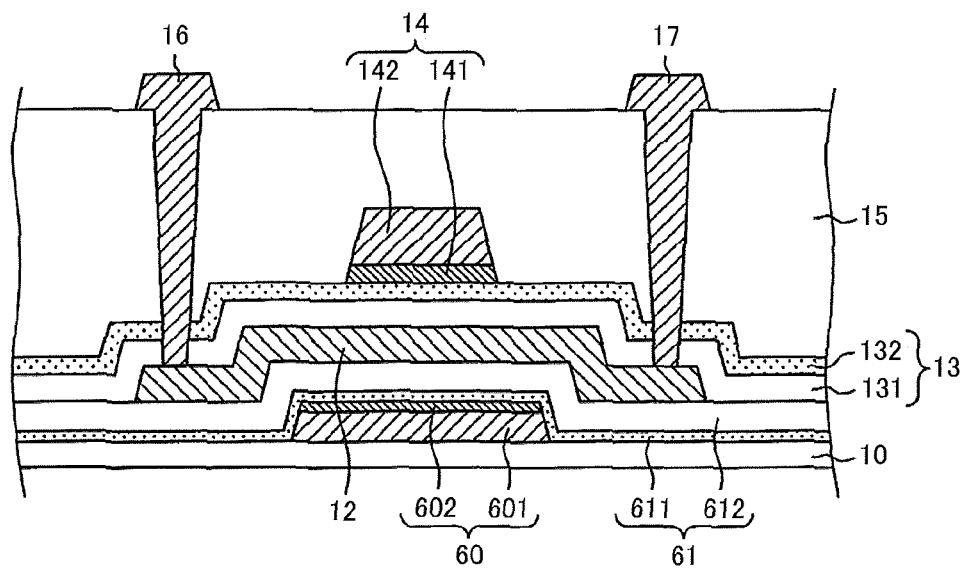
FIG. 11 is a cross sectional view of the third example of the fourth embodiment.

FIG. 11 is a cross sectional view of the second example of the present embodiment. In FIG. 11, the laminated film of the silicon oxide film 612 and the third aluminum oxide film 611 is made for the second gate insulating film 61; the laminated film of the metal layer 601 and the third oxide semiconductor 602 is made for the second gate electrode 60.

In other words, in FIG. 11, the third aluminum oxide film 611 is formed on the second gate electrode 60; the silicon oxide 612 is formed on the third aluminum oxide film 611. The second gate electrode 60 is the structure that the third oxide semiconductor 602 is laminated on the metal layer 601 formed by e.g. MoW. The thicknesses of the layers are the same as explained in the first embodiment.

Figure 12:
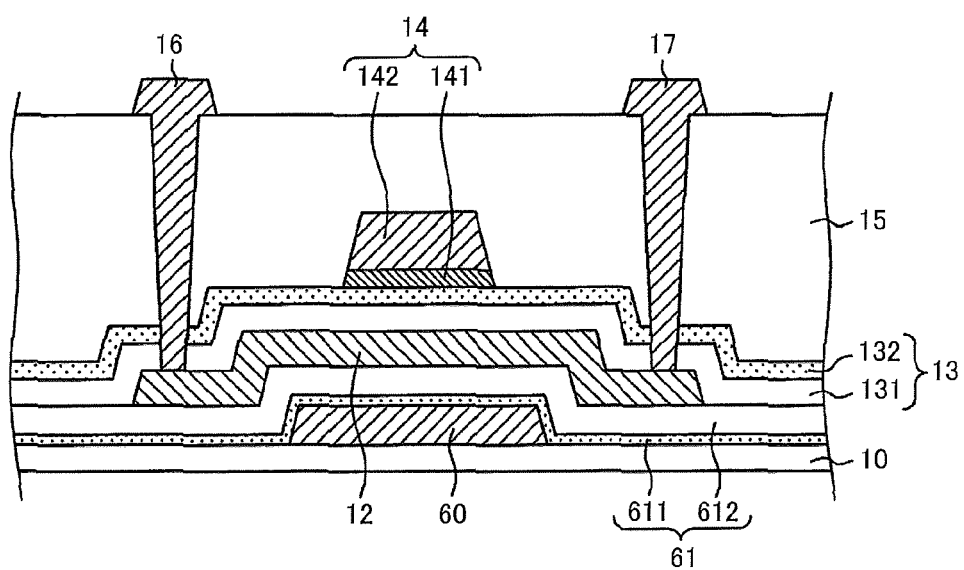
FIG. 12 is a cross sectional view of the fourth example of the fourth embodiment.

FIG. 12 is the structure that the third oxide semiconductor 602 is eliminated from the second gate electrode 60 in the structure of FIG. 11. The effect of the structure of FIG. 12 is the same as explained in the third embodiment. The structures of FIG. 11 and FIG. 12 can realize more reliable dual gate type TFT of the oxide semiconductor. By the way, in FIGS. 11 and 12, too, the protective layer 50 can be formed on the drain area and the source area of the oxide semiconductor 12 as depicted in FIG. 10 to avoid disappearing of the first oxide semiconductor 12 during formation of the through holes.

The Fifth Embodiment

Since the poly-Si has high carrier mobility, a high speed TFT can be realized. On the other hand, the oxide semiconductor has a low leak current, thus, the TFT of the oxide semiconductor is suitable for the switching element. Therefore, using both the TFT of the poly-Si and the TFT of the oxide semiconductor can realize the high quality display device; e.g. the TFT of the poly-Si is used in the driving circuit while the TFT of the oxide semiconductor is used as the switching TFT in the pixel.

Figure 13:
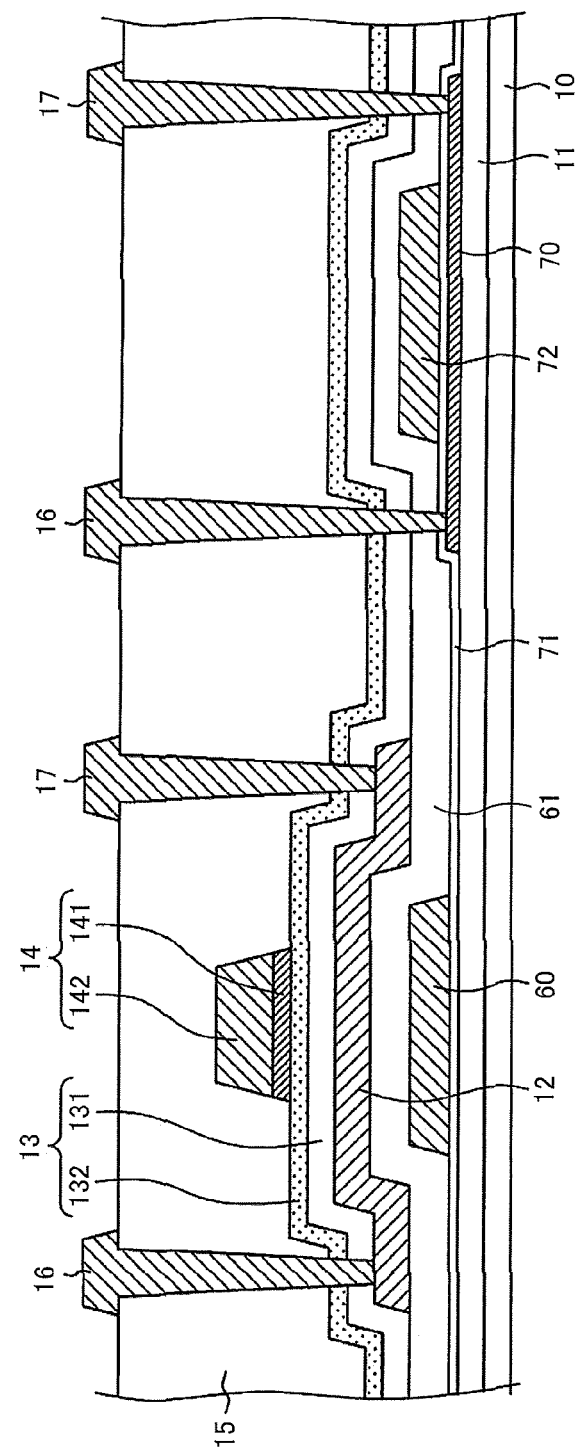
FIG. 13 is a cross sectional view of the fifth embodiment.

FIG. 13 is the cross sectional view of the fifth embodiment of the present invention where the TFT of the poly-Si and the TFT of the oxide semiconductor coexist. This structure is called the hybrid structure. The TFT of the oxide semiconductor is a dual gate type. In FIG. 13, the undercoat 11 is formed on the TFT substrate 10. The structure of the undercoat 11 can be the same as explained in the first embodiment.

Firstly, the TFT of the poly-Si 70 is formed on the undercoat 11. The poly-Si 70 is made as that: the a-Si is formed first on the undercoat 11, then the a-Si is transformed to the poly-Si by applying the excimer laser on the a-Si; subsequently, the poly-Si is patterned. The third gate insulating film 71 is formed covering the poly-Si 70. The third gate insulating film 71 is formed by CVD using TEOS (Tetraethyl orthosilicate) as the material.

The second gate electrode 60 for the TFT of the oxide semiconductor 12 is formed on the third gate insulating film 71; the gate electrode (the third gate electrode) 72 for the TFT of the poly-Si 70 is formed, at the same time. After that, the silicon oxide film 61, which is the second gate insulating film for the TFT of the second semiconductor 12, is formed covering the second gate electrode 60 and the third gate electrode 72; subsequently, the oxide semiconductor 12 is formed on the silicon oxide 61.

The gate insulating film 13, which is made by the silicon oxide film 131 and the aluminum oxide film 132, is formed covering the oxide semiconductor 12; the gate electrode 14, made by the second oxide semiconductor 141 and the metal 142, is formed on the gate insulating film 13 as explained in the first embodiment. By the way, as explained in the second embodiment, the first gate insulating film 13 can be formed only underneath the first gate electrode 14. The second oxide semiconductor 141 can be eliminated from the gate electrode 14 as explained in the third embodiment.

In FIG. 13, the drain electrodes 16 and the source electrodes 17 for the TFT of the oxide semiconductor and the TFT of the poly-Si are made simultaneously. That is to say, in precede, through holes for the drain electrode 16 and the source electrode 17 are formed simultaneously for the TFT of the oxide semiconductor and the TFT of the poly-Si.

As depicted in FIG. 13, the through holes are formed through five insulating films in the poly-Si TFT while the through holes are formed through three insulating films in the oxide semiconductor TFT. Therefore, the oxide semiconductor 12 is exposed to the etching media longer than the poly-Si semiconductor 70 is exposed to; thus, the oxide semiconductor 12 tends to disappear in the etching process.

In addition, the poly-Si 70 must be cleaned by hydrogen fluoride (HF) after the through holes are formed. At the same time, the oxide semiconductor 12, too, is exposed to the hydrogen fluoride (HF); the oxide semiconductor 12 is easily dissolved by the hydrogen fluoride (HF).

Figure 14:
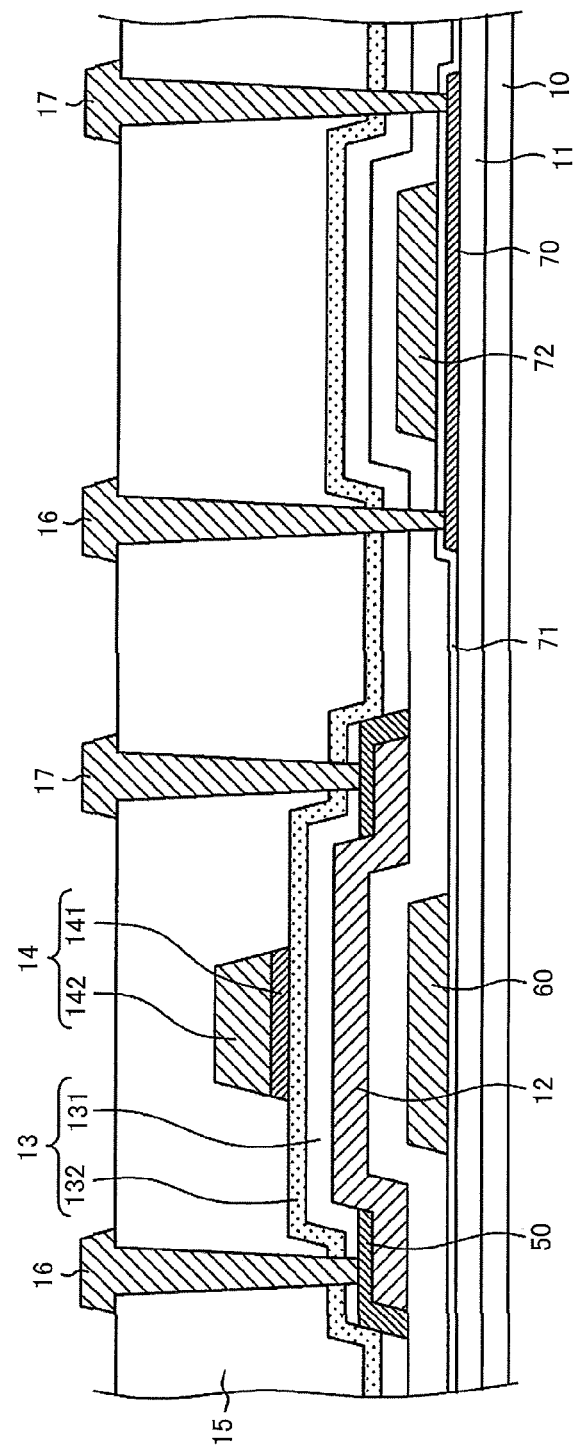
FIG. 14 is a cross sectional view of the second example of the fifth embodiment.

FIG. 14 is the hybrid type TFT that countermeasures this problem. FIG. 14 differs from FIG. 13 in that the metal protective layer 50 is formed on the drain area and the source area of the oxide semiconductor 12. This structure in the TFT of the oxide semiconductor 12 is the same as FIG. 12 of the fourth embodiment.

The TFT of the oxide semiconductor in the structures of FIG. 13 and FIG. 14 are dual gate type, however, the TFT of the oxide semiconductor in this embodiment can be a single gate type as explained in FIGS. 4 to 8. As described above, the hybrid type TFT of excellent performance and high reliability can be realized according the embodiment of the present invention.

Sixth Embodiment

Figure 15:
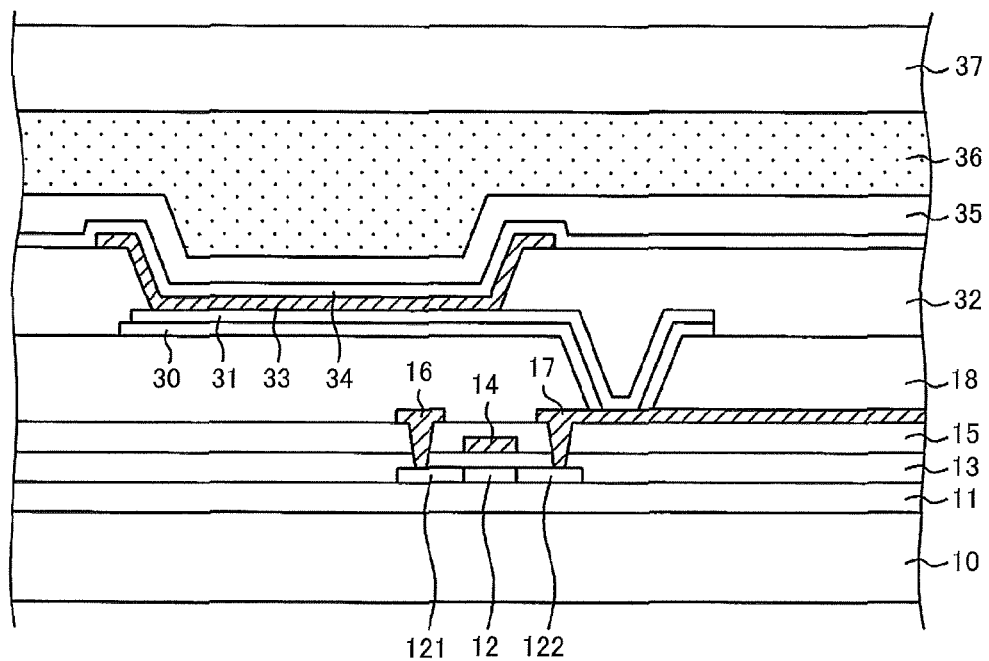
FIG. 15 is a cross sectional view of the organic EL display device.

From the first embodiment through the fifth embodiment, the present invention was explained in regard to the liquid crystal display device. The present invention can be applicable to the organic EL display device as well as to the liquid crystal display device. FIG. 15 is a cross sectional view of the display area of the organic EL display device. In FIG. 15, the TFT is formed on the TFT substrate 10; the organic passivation film 18 is formed on the TFT; the through hole is formed in the organic passivation film 18, which are the same as in the liquid crystal display device.

Therefore, the structures of the TFT of the oxide semiconductor explained in the first embodiment to the fifth embodiment are applicable to the organic EL display device.

In FIG. 15, the reflection electrode 30 is formed on the organic insulating film 18; the oxide conductive film of e.g. the ITO (Indium Tin Oxide) as the anode 31 is formed on the reflection electrode 30. The bank 32 formed by organic substance like acrylic is formed covering the organic passivation film 18 and the anode 31. In the hole of the bank 32, the organic EL layer 33 for light emitting is formed on the anode 31. The organic EL layer 33 is a laminated film of various layers; the thickness of the organic EL layer 33 is thin as several hundred nanometers in total, thus each of the layers is very thin. The bank 32 prevents the organic EL layer 33 from disconnection at the steps of the anode 31 and the reflection electrode 30.

In FIG. 15, the upper electrode, which is cathode 34, is formed over the organic EL layer 33 by the oxide conductive film as e.g. ITO or IZO (Indium Zinc Oxide), or by the thin metal. Since the organic EL layer 33 is decomposed by the moisture, the protective film 35 is formed by e.g. the SiN layer mainly to block external moisture.

The organic EL display device uses the reflection electrode 30; therefore, the external light is reflected by the reflection electrode 30, which deteriorates the visibility of the screen. The circular polarizing plate 37 is adhered to the display surface by the adhesive 36 to prevent the reflection of the external light.

As described above, the structure of the organic EL display device is the same up to forming the drain electrode 16 and the source electrode 17 of the oxide semiconductor 12 as the structure of the liquid crystal display device. Therefore, the present invention explained from the first embodiment through the fifth embodiment is applicable to the organic EL display device.

What is claimed is:
1. A display device comprising:
    a substrate including a display area where plural pixels are formed,
    the pixel includes a first TFT of a first oxide semiconductor,
    a first gate insulating film is formed on the first oxide semiconductor,
    the first gate insulating film is a laminated film of a first silicon oxide film and a first aluminum oxide film,
    a gate electrode is formed on the first aluminum film,
    wherein an interlayer insulating film is formed covering the first gate insulating film and the first gate electrode,
    defect density of the first silicon oxide film is less than defect density of the interlayer insulating film, the defect density of the first silicon oxide film is $1\times10^{18}$ (spins/cm3) or less by ESR (Electrode Spin Resonance) analysis.

2. The display device according to claim 1, wherein a desorption of oxygen from the first silicon oxide film in TDS (Thermal Desorption Spectrometry) analysis, provided M/z=32, the desorption of oxygen (O2) is $1\times10^{15}$ (molecules/cm2) or more at the temperature of 100 to 250 centigrade.

3. The display device according to claim 1, wherein a desorption of N2O from the first silicon oxide film in TDS (Thermal Desorption Spectrometry) analysis, provided M/z=44, the desorption of oxygen (O2) is $8\times10^{13}$ (molecules/cm2) or less at the temperature of 100 to 400 centigrade.

4. The display device according to claim 1, wherein the first oxide semiconductor is formed on a second silicon oxide film, defect density of the second silicon oxide film is $1\times10^{18}$ (spins/cm3) or less by ESR (Electrode Spin Resonance) analysis.

5. The display device according to claim 1, wherein the first oxide semiconductor is formed on a second aluminum oxide film.

6. The display device according to claim 1, a thickness of the first aluminum oxide film is 1 nm to 20 nm.

7. The display device according to claim 1, the first gate insulating film is formed only under the first gate electrode.

8. The display device according to claim 1, the first oxide semiconductor has a drain area that connects with the drain electrode, and a source electrode that connects with the source electrode, a first protective layer of metal or alloy is formed between the drain area and the drain electrode, and a second protective layer of metal or alloy is formed between the source area and the source electrode.

9. The display device according to claim 8, the first protective layer and the second protective layer are formed by the same material as a video signal line.

10. The display device according to claim 1, a second gate insulating film including a third silicon oxide film, a second gate electrode is formed under the second gate insulating film, the first oxide semiconductor film is formed on the third silicon oxide film.

11. The display device according to claim 10, the second gate insulating film is a laminated film of the third silicon oxide film and a third aluminum oxide film, the second gate electrode contacts with the third aluminum oxide film.

12. The display device according to claim 10, the second gate electrode is formed by a laminated film of a metal and a third oxide semiconductor film, the third oxide semiconductor film contacts with the second gate insulating film.

13. The display device according to claim 10, the first oxide semiconductor has a drain area that connects with the drain electrode, and a source electrode that connects with the source electrode, a first protective layer of metal or alloy is formed between the drain area and the drain electrode, and a second protective layer of metal or alloy is formed between the source area and the source electrode.

14. The display device according to claim 13, the substrate has a second TFT of a poly-silicon, a distance between the poly-silicon and the substrate is shorter than a distance between the second gate electrode and the substrate.

15. The display device according to claim 10, the substrate has a second TFT of a poly-silicon, a distance between the poly-silicon and the substrate is shorter than a distance between the second gate electrode and the substrate.

16. A display device comprising:
a substrate including a display area where plural pixels are formed,
the pixel includes a first TFT of a first oxide semiconductor,
a first gate insulating film is formed on the first oxide semiconductor,
the first gate insulating film is a laminated film of a first silicon oxide film and a first aluminum oxide film,
a gate electrode is formed on the first aluminum film,
wherein the first gate electrode is formed by a laminated film that a second oxide semiconductor is laminated by a metal, and
wherein a thickness of the second oxide semiconductor is smaller than a thickness of the first oxide semiconductor.

17. A display device comprising:
a substrate including a display area where plural pixels are formed,
the pixel includes a first TFT of a first oxide semiconductor,
a first gate insulating film is formed on the first oxide semiconductor,
the first gate insulating film is a laminated film of a first silicon oxide film and a first aluminum oxide film,
a gate electrode is formed on the first aluminum film,
wherein the substrate has a second TFT of a poly-silicon,
a distance between the poly-silicon and the substrate is shorter than a distance between the first oxide semiconductor and the substrate.

18. The display device according to claim 17, wherein the first oxide semiconductor has a drain area that connects with the drain electrode, and a source electrode that connects with the source electrode,
a first protective layer of metal or alloy is formed between the drain area and the drain electrode
a second protective layer of metal or alloy is formed between the source area and the source electrode, and
the substrate has a second TFT of a poly-silicon,
a distance between the poly-silicon and the substrate is shorter than a distance between the first oxide semiconductor and the substrate.

* * * * *